US012800670B2

(12) United States Patent
Lesso et al.

(10) Patent No.: US 12,800,670 B2
(45) Date of Patent: Nov. 17, 2026

(54) CHARACTERISING ELECTROCHEMICAL CELLS

(71) Applicant: Cirrus Logic International Semiconductor Ltd., Edinburgh (GB)

(72) Inventors: John P. Lesso, Edinburgh (GB); Claire Motion, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 89 days.

(21) Appl. No.: 18/799,099

(22) Filed: Aug. 9, 2024

(65) Prior Publication Data

US 2026/0043863 A1 Feb. 12, 2026

(51) Int. Cl.

| | |
|---|---|
| ***G01R 31/389*** | (2019.01) |
| ***G01R 31/36*** | (2020.01) |
| ***G01R 31/367*** | (2019.01) |
| ***G01R 31/382*** | (2019.01) |
| ***G01R 31/392*** | (2019.01) |

(52) U.S. Cl.

CPC ....... *G01R 31/389* (2019.01); *G01R 31/3648* (2013.01); *G01R 31/367* (2019.01); *G01R 31/382* (2019.01); *G01R 31/392* (2019.01)

(58) Field of Classification Search

CPC ......................... G01R 31/389; G01R 31/3648; G01R 31/367; G01R 31/382; G01R 31/392; G01N 27/026; G01N 27/028

USPC .......................................................... 324/430

See application file for complete search history.

(56) References Cited

U.S. PATENT DOCUMENTS

| | | | | |
|---|---|---|---|---|
| 6,002,238 A | | 12/1999 | Champlin | |
| 11,559,225 B1 | * | 1/2023 | Lee ...................... | A61B 5/0531 |
| 2009/0326408 A1 | * | 12/2009 | Moon .................... | A61B 5/086 600/547 |
| 2011/0309846 A1 | * | 12/2011 | Elder ................. | G01N 27/3274 324/683 |
| 2016/0050497 A1 | * | 2/2016 | Daubigny ................ | H04R 9/06 381/120 |

(Continued)

FOREIGN PATENT DOCUMENTS

| | | |
|---|---|---|
| DE | 102022202521 A1 | 9/2023 |
| GB | 2619604 A | 12/2023 |

OTHER PUBLICATIONS

International Search Report and Written Opinion of the International Searching Authority, International Application No. PCT/GB2025/051080, mailed Aug. 8, 2025.

*Primary Examiner* — Roberto Velez
(74) *Attorney, Agent, or Firm* — Jackson Walker L.L.P.

(57) ABSTRACT

Circuitry for characterising an electrochemical cell comprising at least one first electrode and a second electrode, the circuitry comprising: drive circuitry configured to apply a stimulus to the at least one first electrode of electrochemical cell, the stimulus having a first stimulation frequency; and measurement circuitry configured to sample a response of the electrochemical cell to the stimulus at a sampling frequency to generate a digital output signal; and processing circuitry configured to determine an impedance of the cell at the first stimulation frequency based on the digital output signal, wherein a first ratio of the first stimulation frequency to the sampling frequency is substantially equal to a second ratio of a number of oscillations of the stimulus to a number of samples obtained by the measurement circuit over a given time period.

28 Claims, 9 Drawing Sheets

(56) References Cited

U.S. PATENT DOCUMENTS

| | | | | |
|---|---|---|---|---|
| 2020/0209179 | A1* | 7/2020 | Bohm | A61B 5/1495 |
| 2021/0077028 | A1* | 3/2021 | Dawoud | A61B 5/068 |
| 2023/0408596 | A1 | 12/2023 | Lesso et al. | |
| 2024/0125864 | A1 | 4/2024 | Lesso et al. | |

* cited by examiner

CHARACTERISING ELECTROCHEMICAL CELLS

TECHNICAL FIELD

The present disclosure relates to circuitry, systems and methods for characterising electrochemical cells.

BACKGROUND

Electrochemical Impedance Spectroscopy (EIS) can be used to interrogate an electrochemical cell to obtain information about a condition of the electrochemical cell. Such information can be used to improve measurements taken with a sensor comprising the electrochemical cell.

When using EIS to interrogate an electrochemical cell, chemistry within the cell can vary substantially over time, particularly at low frequencies. Such changes in cell chemistry can lead to error in measurements of impedance, which in turn can distort downstream processing of signals obtained from the electrochemical cell.

SUMMARY

According to a first aspect of the disclosure, there is provided circuitry for characterising an electrochemical cell comprising at least one first electrode and a second electrode, the circuitry comprising: drive circuitry configured to apply a stimulus to the at least one first electrode of electrochemical cell; and measurement circuitry configured to sample a response of the electrochemical cell to the stimulus to obtain an output signal; and processing circuitry configured to determine a stability of an impedance of the cell at the first stimulation frequency based on a comparison of a frequency spectrum of the stimulus to a frequency spectrum of the measured response.

The processing circuitry may be configured to: determine a difference between the frequency spectrum of the stimulus and the frequency spectrum of the measured response to obtain a difference spectrum; and determined the stability based on the difference spectrum.

The processing circuitry may be configured to determine the stability based on a profile of the difference spectrum.

The processing circuitry may be configured to determined that the impedance is stable if the difference spectrum is substantially flat.

The stimulus may have a first stimulation frequency, and the measurement circuitry may be configured to sample the response of the electrochemical cell at a sampling frequency.

A first ratio of the first stimulation frequency to the sampling frequency may be equal to a second ratio of a number of oscillations of the stimulus to a number of samples obtained by the measurement circuit over a given time period.

The processing circuitry may be configured to determine the impedance of the cell at the first stimulation frequency.

The impedance of the cell may comprise measuring a first characteristic of the output signal at or near the first stimulation frequency.

The first characteristic may comprise one or more of a magnitude and phase at or near the first stimulation frequency.

The processing circuitry may be configured to: apply a Fourier transform to the output signal to obtain a frequency domain representation of the output signal; and determine the first characteristic of output signal from the frequency domain representation.

The processing circuitry may be configured to: apply a Goertzel filter to the digital output signal at the first stimulation frequency to obtain the first characteristic.

The processing circuitry may be configured to: apply a band-pass filter to the digital output signal to obtain the first characteristic, the band-pass filter centred on or overlapping the first stimulation frequency.

The processing circuitry may be configured to: determine a second characteristic in one or more frequency bands adjacent a frequency band comprising the first stimulation frequency; and determine, based on the second characteristic of the one or more frequency bands, a stability metric indicating the stability of the impedance of the cell over time.

The processing circuitry may be configured to: determine a first magnitude in a first frequency band of the digital output signal having a frequency lower than the first stimulation frequency; determine second magnitude in a second frequency band of the digital output signal having a frequency higher than first stimulation frequency; and determine the stability metric based on the first and second magnitudes.

Determining the stability metric may comprise: comparing the first and second magnitudes.

The processing circuitry may be configured to omit a given sample of the digital output signal for use in determining the impedance if the first and second magnitudes of the given sample are unequal.

Determining the stability metric may comprise: determining a difference between the first and second magnitudes, wherein the processing circuitry is configured to: output warning signal or flag if the difference between the first and second magnitudes exceeds a predetermined instability threshold.

The processing circuitry may be configured to: determine a first phase in a first frequency band of the digital output signal having a frequency lower than the first stimulation frequency; determine second phase in a second frequency band of the digital output signal having a frequency higher than first stimulation frequency; and determine a direction of change of the impedance at the first stimulation frequency based on the first and second phases.

The processing circuitry may be configured to: determine an autocorrelation of the digital output signal; and determine, based on the autocorrelation, a stability metric indicating the stability of the impedance of the cell over time.

The processing circuitry may be configured to determine the impedance of the cell based on the determined stability metric.

The impedance may comprise: on determining, based on the stability metric, that the impedance is stable over a predetermined measurement period, calculating the impedance based on the first characteristic.

The impedance of the cell may be calculated based on the first characteristic measured during periods in which the stability metric indicates that stability of the impedance at the first stimulation frequency exceeds a predetermined stability threshold.

The stimulus may comprise at least a first component at the first stimulation frequency and at least a second component at a second stimulation frequency, the second stimulation frequency being an integer multiple of the first stimulation frequency. The processing circuitry may be configured to determine an impedance of the cell at the second stimulation frequency based on the digital output signal.

Determining the impedance of the cell at the first stimulation frequency may comprise determining a first characteristic of the digital output signal at or near the first stimulation frequency. Determining the impedance of the cell at the second stimulation frequency may comprise determining a second characteristic of the digital output signal at or near the second stimulation frequency.

The drive circuitry may comprise a digital-to-analog converter (DAC).

The measurement circuitry may comprise an analog-to-digital converter (ADC).

Where the DAC and ADC are provided, the ADC and DAC may be clocked coherently.

The measurement circuitry may be configured to: determine a condition of the electrochemical cell based on the digital output signal.

The condition may comprise ageing of the electrochemical cell.

The measurement circuitry may comprise: a transimpedance amplifier (TIA) or a current conveyor configured to convert an output of the electrochemical cell to generate the response for sampling by the ADC.

According to another aspect of the disclosure, there is provided a system, comprising: circuitry as described above, and the electrochemical cell. The electrochemical cell may comprises an electrochemical sensor or a battery cell.

The first electrode or the second electrode may comprise an ion-selective electrode.

According to another aspect of the disclosure, there is provided an electronic device, comprising the circuitry or system described above.

The device may comprise one or more of a continuous analyte monitor (such as a continuous glucose monitor), a wearable device, a mobile computing device, a laptop computer, a tablet computer, a games console, a remote control device, a home automation controller or a domestic appliance, a toy, a robot, an audio player, a video player, or a mobile telephone, and a smartphone.

According to another aspect of the disclosure, there is provided a method of characterising an electrochemical cell comprising at least one first electrode and a second electrode, the method comprising: applying a stimulus to the at least one first electrode of electrochemical cell, the stimulus having a first stimulation frequency; sampling a response of the electrochemical cell to the stimulus at a sampling frequency to generate a digital output signal; and determining an impedance of the cell at the first stimulation frequency based on the digital output signal, wherein a first ratio of the first stimulation frequency to the sampling frequency is substantially equal to a second ratio of a number of oscillations of the stimulus to a number of samples obtained by the measurement circuit over a given time period.

According to another aspect of the disclosure, there is provided circuitry for quantifying drift in an electrochemical impedance spectroscopy (EIS) measurement, the circuitry comprising: drive circuitry configured to apply a time-varying stimulus to the at least one first electrode of electrochemical cell at a stimulation frequency; measurement circuitry configured to measure response of the cell to the time-varying stimulus at first and at least a second frequencies; and processing circuitry configured to determine a drift in impedance of the electrochemical cell based on the measurement.

The processing circuitry may be configured to: estimate a future value of the impedance based on the measured response and the determined drift.

The processing circuitry may be configured to: output a warning signal or flag if the estimated future value is outside of a predetermined safety range.

The measurement circuitry may be configured to sample the measured response at a sampling frequency, wherein, over a given time period, a first ratio of the stimulation frequency to the sampling frequency is substantially equal to a second ratio of a number of oscillations of the stimulus to a number of samples obtained by the measurement circuit.

According to another aspect of the disclosure, there is provided a method of quantifying drift in an electrochemical impedance spectroscopy (EIS) measurement, the method comprising: applying a time-varying stimulus to an electrochemical cell at a stimulation frequency; measuring a response of the cell to the time-varying stimulus at first and second frequencies; and determining a drift in impedance of the electrochemical cell based on the measurement.

According to another aspect of the disclosure, there is provided circuitry for quantifying drift in an electrochemical impedance spectroscopy (EIS) measurement, the circuitry comprising: drive circuitry configured to apply a time-varying stimulus to the at least one first electrode of electrochemical cell at a stimulation frequency; and measurement circuitry configured to measure response of the cell to the time-varying stimulus; and processing circuitry configured: performing an autocorrelation on the measured response; and to determine a drift in impedance of the electrochemical cell based on the autocorrelation.

The measurement circuitry may be configured to sample the measured response at a sampling frequency, wherein, over a given time period, a first ratio of the stimulation frequency to the sampling frequency is substantially equal to a second ratio of a number of oscillations of the stimulus to a number of samples obtained by the measurement circuit.

According to another aspect of the disclosure, there is provided a method of quantifying drift in an electrochemical impedance spectroscopy (EIS) measurement, the method comprising: applying a time-varying stimulus to an electrochemical cell at a stimulation frequency; measuring a response of the cell to the time-varying stimulus; performing an autocorrelation on the measured response; and determining a drift in impedance of the electrochemical cell based on the autocorrelation.

According to another aspect of the disclosure, there is provided a system for electrochemical sensing, the system arranged to: apply a stimulus to an electrochemical cell; measure a response of the electrochemical cell to the stimulus; determine an impedance of the electrochemical cell based on the measured response; generate a stability metric representing a stability of the determined impedance; and based on the stability metric, perform one or more of: correcting the determined impedance based on the stability metric; generating a warning signal or flag based on at least the stability metric; and quantifying the stability of the determined impedance.

The warning signal or flag may be generated based on a combination of the stability metric and an analyte level derived from the determined impedance.

The system may be configured to: monitor an analyte level derived from the determined impedance over a monitoring period; monitor the stability metric over the monitoring period; and estimate a future analyte level based on the monitored analyte level and the monitored stability metric.

Throughout this specification the word “comprise”, or variations such as “comprises” or “comprising”, will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

Embodiments of the present disclosure relate to methods and systems for improving the resilience of measurement circuitry to variations in cell chemistry (and therefore impedance) over time. In particular, embodiments of the present disclosure use techniques of coherent sampling to detect and quantify time varying impedance of electrochemical cells.

Figure 1:
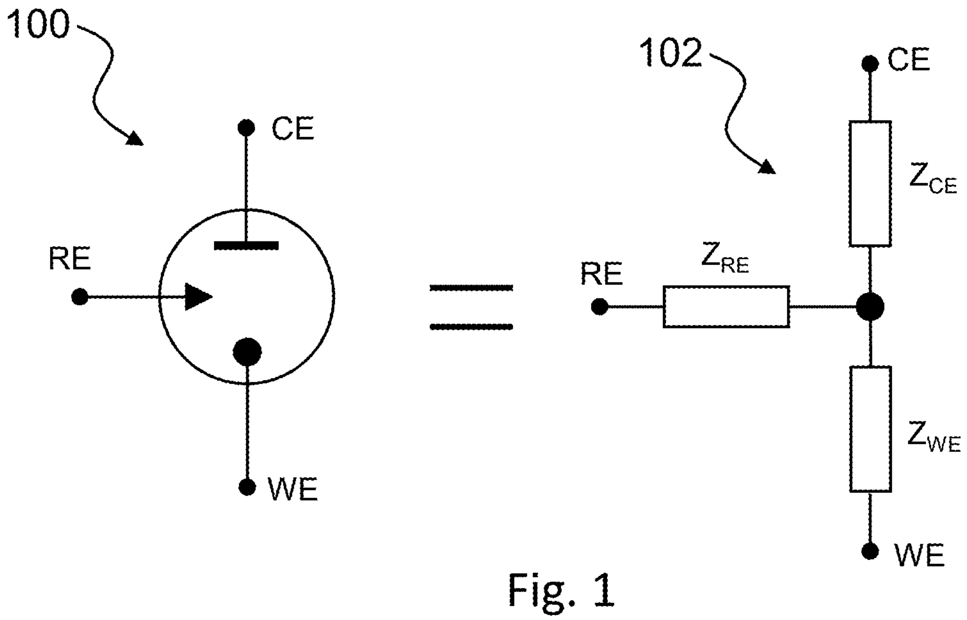
FIGS. 1 and 2 are schematic diagrams of electrochemical cells.

FIG. 1 is a schematic diagram of an example electrochemical cell 100 comprising three electrodes, namely a counter electrode CE, a working electrode WE and a reference electrode RE. FIG. 1 also shows an equivalent circuit 102 for the electrochemical cell 100 comprising a counter electrode impedance ZCE, a working electrode impedance ZWE and a reference electrode impedance ZRE.

Figure 2:
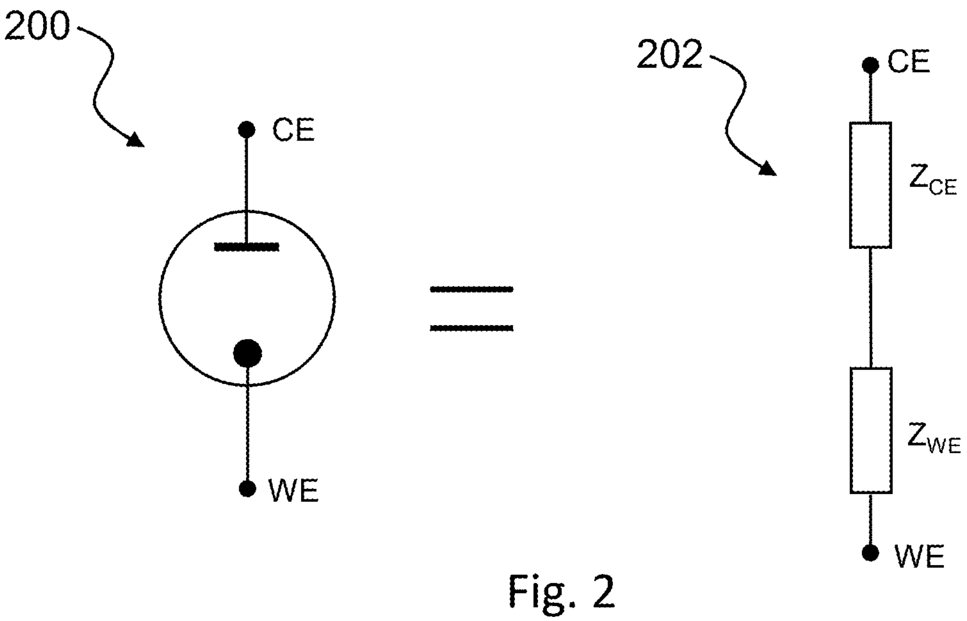

FIG. 2 is a schematic diagram of another example electrochemical cell 200 comprising two electrodes, namely a counter electrode CE and a working electrode WE. The electrochemical cell 200 varies for the cell 100 with the omission of the reference electrode RE. FIG. 2 also shows an equivalent circuit 102 for the electrochemical cell 200 comprising a counter electrode impedance ZCE and a working electrode impedance ZWE.

In some embodiments, the working electrode WE comprise an assay or chemical of interest. For example for the analysis of glucose as an analyte, the working electrode may comprise a layer of glucose oxidase. The counter electrode CE is provided to form an electrical or ohmic connection with the working electrode WE. Optionally, the reference electrode is provided, which is typically a sensing point between the working electrode WE and the counter electrode CE, allowing independent measurement of the potential associated with each of the working and counter electrodes WE. CE, rather than just measuring a potential difference between the counter and working electrodes CE, WE.

Embodiments of the present disclosure will be described with reference to these example electrochemical cells 100, 200. It will be appreciated, however, that the techniques and apparatus described herein may be used in conjunction with any conceivable electrochemical system, including but not limited to electrochemical cells comprising at least two electrodes (e.g. a counter electrode CE, a working electrode WE and optionally a reference electrode RE), or electrochemical cells with more than three electrodes (e.g. two or more counter electrodes and/or two or more working electrodes). Electrodes of the electrochemical cells described herein may also be referred to as anodes and/or cathodes as is conventional in the field of electrical batteries.

The cells 100, 200 may be implemented for potentiometric measurement or potentiostatic measurement.

In potentiostatic arrangements, to determine a characteristic of either of the electrochemical cells 100, 200, and therefore an analyte concentration, it is conventional to apply a bias voltage at the counter electrode CE and measure a current at the working electrode WE. When provided, the reference electrode RE may be used to measure a voltage drop between the working electrode WE and the reference electrode RE. The bias voltage is then adjusted to maintain the voltage drop between the reference and working electrodes RE, WE constant. As the resistance in the cell 100 increases, the current measured at the working electrode WE decreases. Likewise, as the resistance in the cell 100 decreases, the current measured at the working electrode WE increases. Thus the electrochemical cell 100 reaches a state of equilibrium where the voltage drop between the reference electrode RE and the working electrode WE is maintained constant. Since the bias voltage at the counter electrode CE and the measured current at WE are known, the resistance of the cell 100 can be ascertained.

When the cells 100, 200 are configured for potentiometric sensing, a potential across the cells 100, 200 may be measured without applying any bias voltage to the cells 100, 200. In such configurations, the working electrode WE may comprises an ion-selective membrane, which may be configured to uptake only a specific ion (in this case the cation, I+) from an electrolyte solution. As such, the potential difference between the working electrode WE and the reference electrode RE depends on the concentration of that particular ion analyte in the electrolyte solution.

Figure 3:
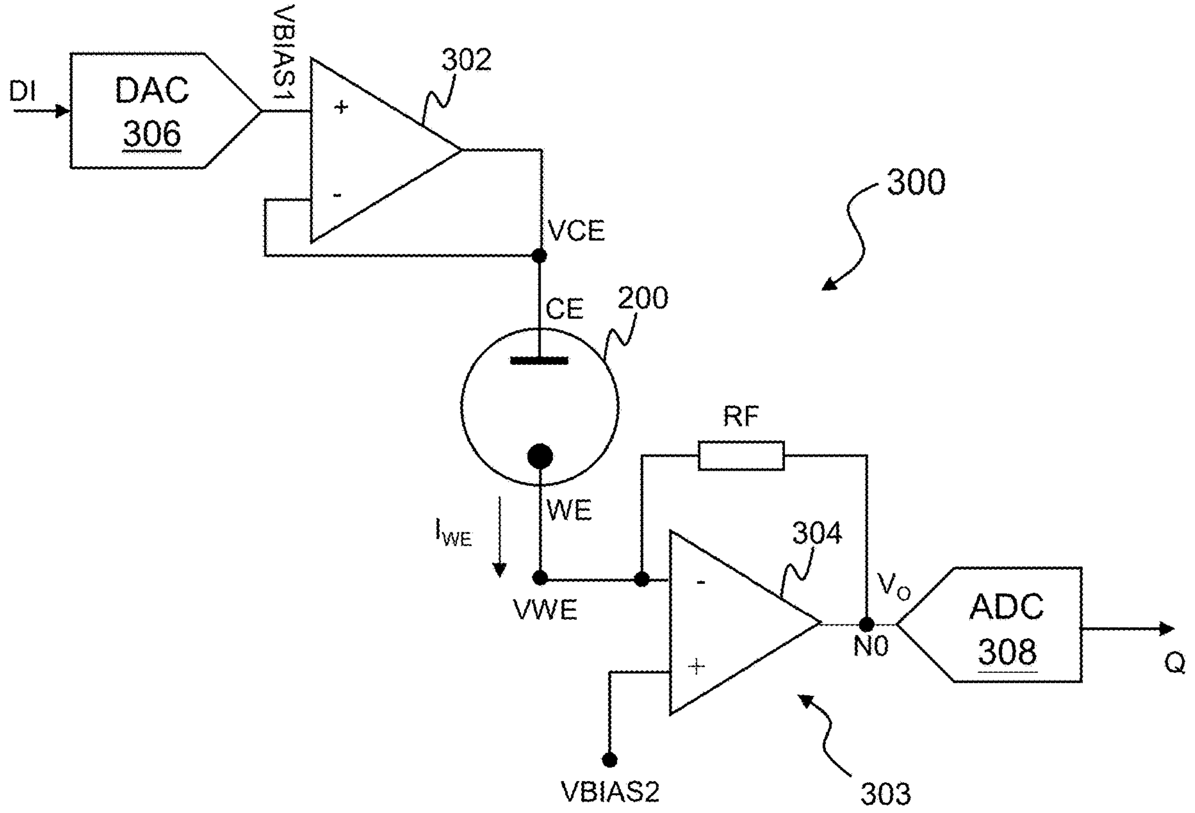
FIG. 3 is a schematic diagram of a known measurement circuit for characterising the electrochemical cell of FIG. 1.

FIG. 3 illustrates an example drive and measurement circuit 300 which is configured to measuring an analyte concentration in the electrochemical cell 200 shown in FIG. 2. The circuit 300 comprises a first amplifier 302 and a gain stage 303 comprising a second amplifier 304 and a feedback resistor RF, a digital-to-analog converter (DAC) 306, and an analog-to-digital converter (ADC) 308.

Each of the first and second amplifiers 302, 304 may comprise one or more op-amps. A non-inverting input of the first amplifier 302 is coupled to a bias voltage VBIAS1 which is generated by the DAC 306 based on a digital input signal DI. An inverting input of the first amplifier 302 is coupled to the counter electrode CE. An output of the first amplifier 302 is coupled to the counter electrode CE and configured to drive the counter electrode CE with a counter electrode bias voltage VCE. The counter electrode bias voltage VCE applied at the counter electrode CE by the first amplifier 302 is proportional to the difference between the bias voltage VBIAS1 and the counter electrode voltage VCE.

An inverting input of the second amplifier 304 is coupled to the working electrode WE and the non-inverting input of the second amplifier 304 is coupled to a reference voltage, VBIAS2. VBIAS2 may be set to a constant reference voltage, such as half the supply voltage of the circuit 300 (i.e., VDD/2). Alternatively, VBIAS2 may be variable. By controlling the bias voltage VBIAS1 and the reference voltage VBIAS2, a differential bias voltage between the working and reference electrodes WE, RE can be controlled. A feedback loop comprising a feedback resistor RF is coupled between the inverting input and an output of the second amplifier 304. As such, the gain stage 303 operates as a transimpedance amplifier (TIA). The feedback serves to maintain the working electrode WE at the reference voltage VBIAS2 provided at the non-inverting input of the second amplifier 304. The gain stage 303 is thus operable to output an output voltage VO at an output node NO which is proportional to the current IWE at the working electrode WE. The output voltage VO is then provided to the analog-to-digital converter (ADC) 308 which outputs a digital output Q which represents the current IWE at the working electrode WE. Alternative gain arrangements to that shown in FIG. 3 exists for processing the working electrode current IWE. The arrangements shown in FIG. 3 is provided for example only. Equally, alternative drive circuitry to that shown in FIG. 3 exist for driving the counter electrode CE. The gain and drive arrangements shown in FIG. 3 are provided for example only and other arrangements are known in the art.

To bias the counter electrode CE, and therefore the electrochemical cell 200, at different voltages, the bias voltage VBIAS1 may be adjusted, for example between ground (e.g. zero volts) and the supply voltage VDD. As an example, with the non-inverting input voltage VBIAS2 of the second amplifier 204 set at VDD/2, a positive bias may be applied to the cell 200 by maintaining the bias voltage VBIAS1 above VDD/2. Likewise, a negative bias may be applied to the cell 200 by maintaining the bias voltage VBIAS1 below VDD/2. Additionally or alternatively to varying the bias voltage VBIAS1, the reference voltage VBIAS2 may be adjusted to set the voltage at the working electrode WE, and therefore the electrochemical cell 200.

The circuitry 300 shown in FIG. 3 may be used for electrochemical impedance spectroscopy (EIS). The electrochemical cell 200 may be interrogated to obtain information about a condition of the electrochemical cell 200, which may be used to improve measurements taken using the circuitry 300. To perform EIS, an oscillating stimulus (e.g. a sine, square, or triangle wave) is applied to the cell 200 via the counter electrode CE and the response to that stimulus measured at the working electrode WE. In doing so, the cell 200 is driven by time varying voltage VCE which results in a current IWE at the working electrode. The counter electrode voltage VCE and the working electrode current IWE are relates via impedance Z of the cell, hence:

$$I_{WE} = \frac{V_{CE}}{Z}$$

Due to inherent non-linearity of the electrochemical cell 200 and variations in chemistry of the electrochemical cell 200, impedance measurements can vary substantially over time when using EIS. This can lead to erroneous measurements of impedance that can distort measurements of the cell 200.

Embodiments of the present disclosure aim to address or at least ameliorate one or more of the above issues by providing techniques for monitoring the stability of impedance of the cell using EIS. To do so, a response to a EIS stimulus may be coherently sampled.

Taking into account the above equation relating working electrode current IWE to counter electrode voltage VCE, coherence between stimulating and sampling is achieved when the following condition is met:

$$\frac{f_{in}}{f_{sample}} = \frac{N_{cycles}}{N_{samples}}$$

$f_{in}$ is the frequency of a oscillating stimulus applied to cell 200. $f_{sample}$ is the sampling frequency used to sample a response of the cell 200 (e.g. the sampling frequency of the ADC 308) to the stimulus. $N_{cycles}$ is the number of complete oscillations of the stimulus over a sampling period. $N_{cycles}$ is the number of sample collected over that same sampling period.

By sampling coherently, the dynamic range is limited by the data converter (i.e. the ADC 308). In addition, by using the technique, both the impedance of the cell 200 at a given frequency and the stability of that impedance at that frequency can be obtained.

Referring again to the equation above relating working electrode current IWE, counter electrode voltage VCE, and impedance Z, variations in impedance Z over time can be modelled and simulated to determine the effect of coherent sampling.

Figure 4:
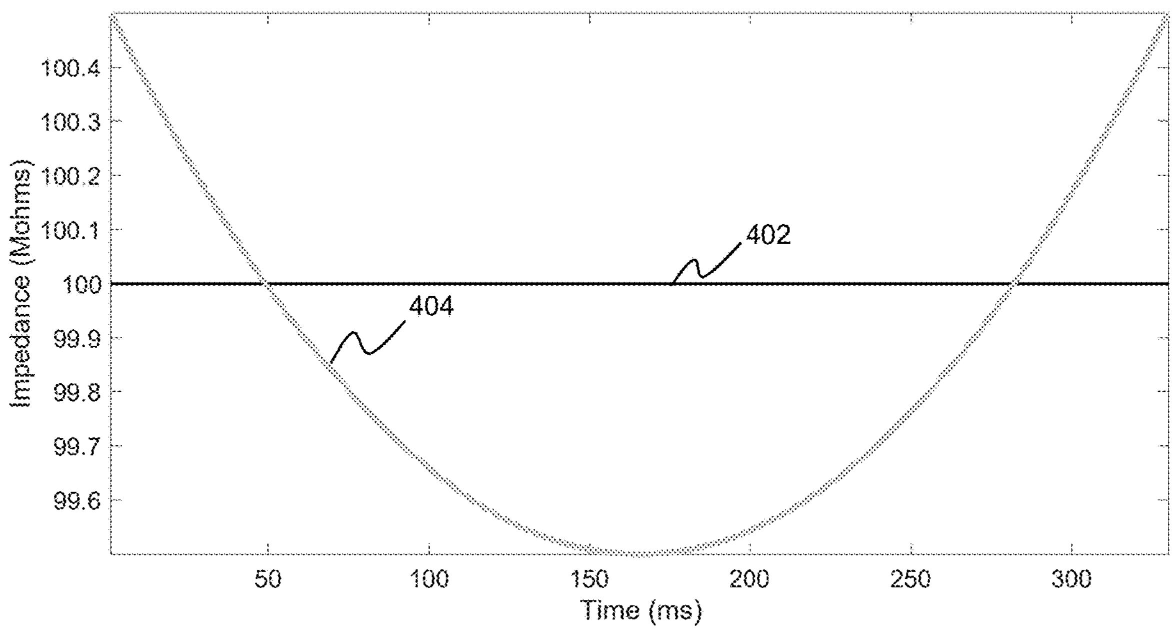
FIG. 4 is a graph showing time vs impedance for a stable impedance condition and a time varying impedance condition in an electrochemical cell.

FIG. 4 is a graphical illustration of time T vs impedance Z for two example scenarios. In a first scenario, the impedance Z is constant, denoted by line 402 in FIG. 4. In a second scenario, the impedance Z is time varying, denote by line 404 in FIG. 4.

Figure 5:
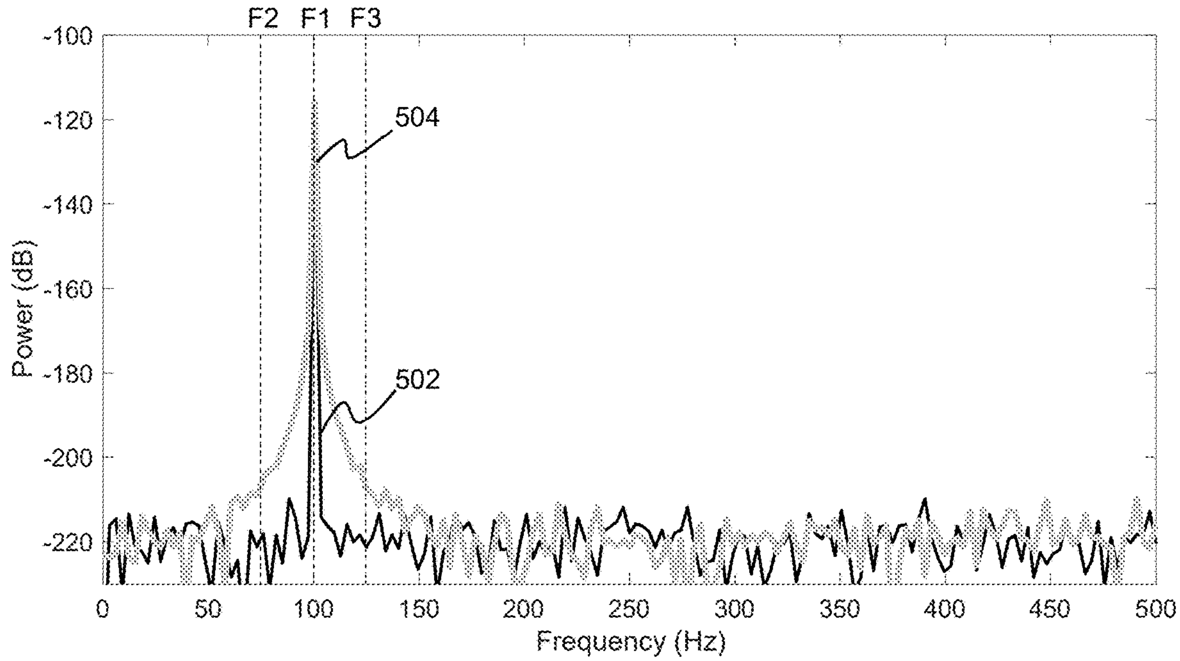
FIG. 5 is a frequency spectrum of responses of an electrochemical cell to a time-varying stimulus in the stable impedance condition and the time-varying impedance condition shown in FIG. 4.

FIG. 5 is a graphical illustration of a frequency spectrum of respective first and second measured responses 502, 504 of the cell 200 responsive to an EIS stimulus VCE, applied at the counter electrode CE, of 1V at 100 Hz. The first measured response 502 pertains to the first scenario referred to above in which the impedance Z is constant over time. The second measured response 504 pertains to the second scenario referred to above in which the impedance Z is time varying. The frequency spectrum shown in FIG. 5 may be obtained by applying a Fourier transform to digital output DO output from the ADC 308.

It can be seen from FIG. 5 firstly that in both the first and second measured responses 502, 504 have a peak impedance Z at 100 Hz (i.e. at the frequency of the stimulus applied to the cell 200). In addition, it can be seen that spectral leakage varies between the first and second measured responses 502, 504, there being more spectral leakage in the second measured response.

Thus, the inventors have found that spectral leakage provides a robust means to quantify how stable the impedance Z of the cell 200 is at a given frequency over a given sampling window, as will be described in more detail below.

Figure 6:
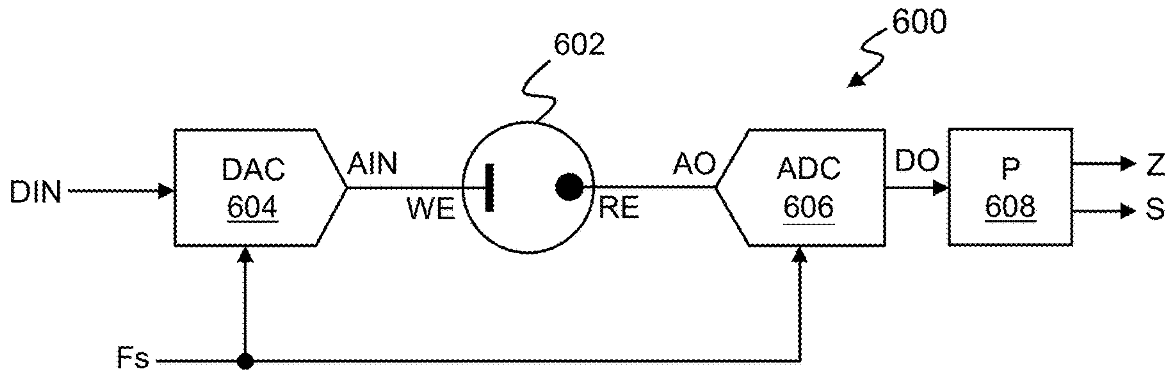
FIG. 6 is a schematic diagram of a measurement circuit for characterising an electrochemical cell.

Having regard for the above, FIG. 6 is a simplified illustration of an example drive and measurement circuit 600 which is configured to sample a measured response of an electrochemical cell 602 to a time varying stimulus. The circuit 600 comprises a DAC 604, an ADC 606, and processing circuitry 608.

In the example, the cell 602 comprises an ion-selective electrode (labelled as a working electrode WE in this example) and a reference electrode RE. In other embodiments, the electrochemical cell 602 may be replaced with any other potentiometric or potentiostatic electrochemical cell, such as the cell 100 or the cell 200, each comprising a working and counter electrodes WE, CE.

The DAC 604 is configured to generate an analog input signal AIN based on a digital input signal DIN and apply the analog input signal to the working electrode WE of the cell 602. The ADC 606 is configured to output an analog response signal AO derived from the reference electrode RE of the cell 602 to a digital output DO. The circuit 600 may comprise additional drive circuitry (not shown) between the DAC 604 and the working electrode WE, such as the amplifier 302 of FIG. 2. Additionally, or alternatively, the circuit 600 may comprise additional measurement circuitry (not shown) between the reference electrode RE and the ADC 308, such as the gain stage 303 shown in FIG. 3. In some embodiments, such additional measurement circuitry may comprise a transimpedance amplifier (TIA) or a current conveyor (CC). In some embodiments, such additional drive and measurement circuitry may be integrated with the DAC 306 and/or the ADC 308 respectively.

Each of the DAC 306 and ADC 308 may be clocked at a common (coherent) sampling frequency Fs. As such, the ADC 606 may be configured to sample the reference electrode RE coherently with the sampling by the DAC 604 of the digital input signal DIN.

The digital output DO is provided to the processing circuitry 608 which may be configured to process the digital output DO to determine an impedance Z of the cell 602 at a certain frequency F1 and a score S based on the digital output DO. The score S may be a measure of the spectral leakage at one or more frequencies of interest (i.e. the frequency or frequencies of the stimulus).

The spectral leakage may be quantified using various techniques.

In one example, with reference to FIG. 5, a ratio RF of the power in a centre frequency bin F1 containing the coherence frequency to the sum of power in side frequency bins F2, F3 either side of the centre frequency bin F1 may be calculated. Additionally or alternatively, a logarithm of the ratio RF may be calculated.

Additionally or alternatively, a ratio of the power in the centre frequency bin F1 to the power in all other frequency bins may be calculated.

Additionally or alternatively, a phase difference between the actual frequency of the peak impedance to the expected frequency of the peak impedance may be determined.

Additionally or alternatively, a difference between a frequency spectrum of the stimulus and a frequency spectrum of the measured response (e.g. the digital output) may be calculated. A difference spectrum may then be obtained. The score S may be determined based on the difference spectrum. For example, if a profile of the spectrum is substantially flat as a function of frequency, this may be an indication that the impedance is stable. Conversely, if the spectrums have different shapes, such that the difference spectrum profile is uneven, this may indicate instability in the impedance.

Figure 7:
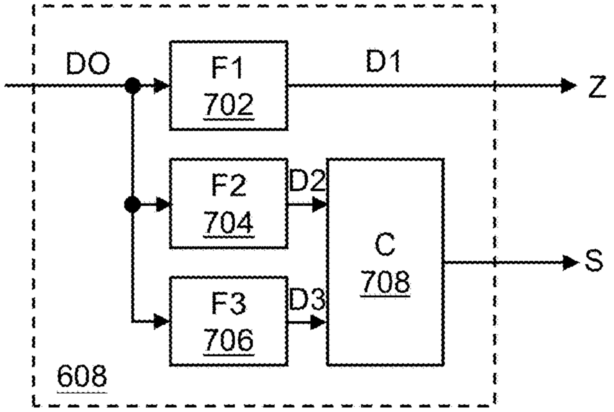
FIGS. 7 and 8 are schematic diagrams of examples of processing circuitry of the measurement circuit of FIG. 6.

FIG. 7 is a block diagram of an example implementation of the processing circuitry 608. In this example, the processing circuitry 608 comprises a first filter 702, a second filter 704, a third filter 706, and a combiner 708.

The digital output signal DO from the ADC 308 is provided to each of the first, second and third filters 702, 704, 706 and generate first, second and third filtered signals D1, D2, D3. The first filtered signal F1 is output as the impedance Z of the cell 602. The second and third filtered signals F2, F3 are provided to the combiner 708 which is configured to combined the filtered signals F2, F3 and output a score S representative of a stability (over time) of the impedance Z of the cell 602. Operation of each of the first, second, third filters 702, 704, 706, and the combiner 708 will now be described.

The first filter 702 may be configured to filter the digital output signal DO to pass frequency components in a first frequency range F1 centred at the first frequency corresponding to the frequency of excitation (i.e. the frequency of the stimulus SIN) and output the first filtered signal D1. A power of the filter signal output from the first filter 704 may correspond to the impedance Z of the cell 602.

The second filter 704 may be configured to filter the digital output signal DO to pass frequency components of the digital output signal DO in a second frequency range F2 below the first frequency range F1, and output the second filtered signal D2.

The third filter 706 may be configured to filter the digital output signal DO to pass frequency components of the digital output signal DO in a third frequency range F3 above the first frequency range F1, and output the third filtered signal D3.

Each of the first, second and third filters 702, 704, 706 may be digital filters implemented using any conceivable architecture. For example, each of the filters may implement one of a discrete Fourier transform (DFT), a fast Fourier transform (FFT), or an autocorrelation, infinite impulse response (IIR) calculation, band-pass filtering, and/or a Goertzel algorithm.

Optionally, a phase locked loop (PLL) may be provided between the ADC 308 and each of the filters 702, 704, 706. This may be particularly applicable when the ADC 308 is implemented as a sigma-delta ADC operating at an oversampled rate. A PLL can provide the faster clock required for such operation. For example, for a sampling frequency of 48 kHz, a sigma-delta ADC may operate at 64 times the sampling frequency, i.e. 3.072 MHz.

An advantage of implementing a Goertzel algorithm in each of the first, second and third filters 702, 704, 706 of the processing circuitry 608 is the ability to compute power at specific frequencies (or frequency bands) without the need for performing a full DFT across the entire frequency spectrum. In doing so, computational power and complexity is reduced, as is the time taken to perform such calculations. The first, second and third filters 702, 704, 706 may implement a Goertzel algorithm in real time, thus avoiding the need for buffering. In doing so, first, second and third filters 702, 704, 706 act as time domain filters. The lack of need for a buffer is significant at lower frequencies since at such frequencies any such buffer would be large when compared to buffers required for higher frequency signals. A Goertzel algorithm may be implemented if the number of frequencies (or bands) required for any follow-on processing is less than about 10% of the total number of data points. For example, if a corresponding DFT would output a frequency spectrum comprising 100 frequency bands and the results of less than 10 of those frequency bands were needed, then it becomes more efficient to perform individual Goertzel algorithms to obtain results for each of the requisite bands.

The Goertzel algorithm may be implemented to target a single DFT coefficient, X[k], at a chosen frequency, using a method derived from the DFT definition but optimised for computation of specific terms. First, the specific frequency or frequencies at which to evaluate the DFT are identified. Denoting these target frequencies as f, for each target frequency f, the corresponding DFT bin k can be calculated using the following equation:

$$k = \left\lfloor \frac{f \cdot N}{F_s} \right\rfloor$$

Where N is the number of points in the DFT, Fs is the sampling frequency of the ADC 308. The brackets used in the above equation denotes rounding the result of the division to the nearest integer. It is noted, however, that when the output AO is sampled coherently, the result of the above division will be an integer number by construct, since all samples will fit into bin k corresponding to the respective target frequency f.

To calculate magnitude and phase of a signal x at a specific frequency, a first stage in the Goertzel algorithm is to calculate an intermediate sequence based on the input sequence x[n], where n ranges from zero to N−1 (where N is the number of points in the DFT). Initializing variables s[n−1] and s[n−2] to zero, the intermediate sequence s[n] is calculated as follows:

$$s[n] = x[n] + 2\cos\left(\frac{2\pi k}{N}\right)s[n-1] - s[n-2]$$

The next stage applies the following filter to s[n], producing an output sequence X[k]:

$$X[k] = s[n] - e^{-i\frac{2\pi k}{N}} s[n-1]$$

This result corresponds to the complex DFT coefficient at the target frequency f, which can then be used to find the magnitude and phase of the signal x at that frequency f.

There are various ways in which the combiner 708 can be implemented, examples of which will now be described.

For example, the combiner 708 may be configured to determine a level of instability based on the magnitude of one or both of the first and second filtered signals D2, D3. As noted above, spectral leakage increases with impedance instability.

Additionally, or alternatively, the combiner 708 may be configured to determine a direction of change of the impedance Z at a given frequency. For example, the combiner 708 may be configured to compare the second and third filtered signals D2, D3 to infer one or more characteristics of instability of response signal AO. If the magnitude of the second and third filtered signals D2, D3 are equal, this may be an indication that the impedance Z is stable over a certain time period. If the magnitude of the second filtered signal D2 is greater than the magnitude of the third filtered signal D3, this may be an indication that the impedance Z is drifting up, i.e. increasing. If the magnitude of the second filtered signal D2 is less than the magnitude of the third filtered signal D3, this may be an indication that the impedance Z is driving down, i.e. decreasing. Thus, the first and second filtered signals D2, D3 may be used to determine sensor drift in the cell 602.

By combining the comparison (or ratio) of the magnitude of second and third filtered signals D2, D3 with the measurement of magnitude of one or both of the second and third filtered signals D2, D3, a determination may be made as to the timescale over which the signal is stable, increasing or decreasing. For example, a high magnitude in one or both of the side bands F2, F3 may indicate instability. If both side bands are equal in magnitude, this may indicate that in the short term there has been drift both high and low, whilst in the long term the response signal AO may have been relatively stable.

Based on measurements of stability or drift of impedance, the processing circuitry 608 may be configured to output a warning signal or flag to indicate one or more conditions at the cell 602. Such conditions may be associated with dangerous levels of an analyte in the cell 602. For example, a rate of drift exceeding a threshold may trigger a warning signal or flag. For example, a determination that an analyte concentration is outside of a safe range, a warning signal of flag may be triggered. This trigger may be based on the comparison of magnitudes of side bands F2, F3, for example. In another example, a warning signal or flag may be generated based on a combination of the stability metric or score and a determined analyte concentration (obtained based on the impedance). For example, if an analyte concentration falls outside a safe range, the stability of the impedance becomes more critical. Where the analyte is glucose, for example, if the glucose concentration measured using the cell 602 is above a safe range but falling, then the warning signal may not need to be generated. Conversely, if the glucose level is outside of the safe range and still rising, then a warning signal or flag should be generated to indicate a dangerous glucose condition.

Drift or stability measurements may also be used to estimate future values of impedance. For example, based on a determined drift, the processing circuitry 608 may determine a value of the impedance (and therefore a sensor condition, sensor health and/or an analyte concentration) at some time in the future. The warning signal of flag may be output based on this estimated future value, for example if the future value of impedance falls outside of a predetermined safe range.

The determined drift of stability may also be used to correct a measured impedance.

As noted above, the second and third signals D2, D3 provide information regarding impedance stability and drift. As such, such signals can be used to improve measurements of impedance, i.e. those measurements derived from the first filtered signal D1.

To improve the estimate of impedance Z, the second and third filtered signals D2, D3 may be used to determine how impedance Z is calculated based on the first filtered signal D1.

Figure 8:
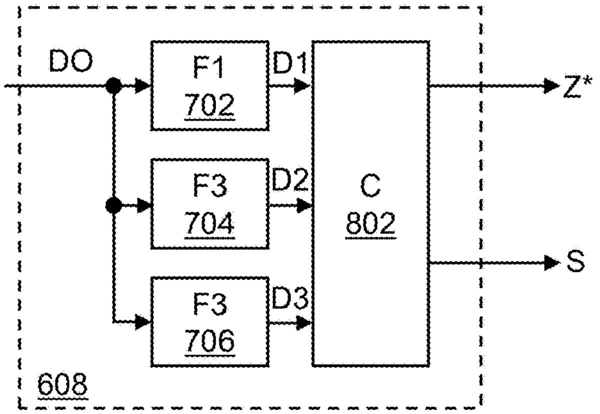

FIG. 8 is a block diagram of an example implementation of the processing circuitry 608 which is variation of the implementation shown in FIG. 7, like part being given like numbering. In place of the combiner 708, the processing circuitry 608 in this example comprises a combiner 802 which is configured to receive the first, second and third filtered signals D1, D2, D3 from respective first, second and third filters 702, 704, 706, and output an impedance measurement Z* and a score S.

In this example, the combiner 802 may be configured to perform any of the operations described above with reference to the combiner 708 of FIG. 7.

Additionally, the combiner 802 may be configured to output an impedance value Z* based on the first filtered signal D1 from the first filter 702. Outputting the impedance value Z* may comprise simply passing through the first filtered signal D1 as the impedance value Z*.

Alternatively, the combiner 802 may be configured to output the impedance value Z* based on the second and/or third filtered signals D2, D3 in addition to the first filtered signal D1. For example, the second and third filtered signals D2, D3 may be used to determine which samples of the first filtered signal D1 to base the impedance value Z* on. For example, a determination could be made regarding the stability of the impedance of the cell 602 based on the second and/or third filtered signals D2, D3. If it was found that the stability above a threshold stability based on a sample of the second and/or third filtered signals D2, D3, the corresponding sample of the first filtered signal D1 could be used for a determination of the impedance Z*. The combiner 802 may generate a stability metric based on the second and/or third filtered signals D2, D3. If the stability metric indicates that the impedance Z of the cell 602 has been stable for a predetermined period of time, the combiner 802 may output an impedance value Z* based on the first filtered signal D1.

In embodiments described above, magnitude of sidebands (e.g. filtered signals D2, D3) is used to quantify impedance stability. In addition or as an alternative to using magnitude of the second and third filtered signals D2, D3 to determine a direction of change of the impedance Z of the cell 602, the inventors have found that phase of the second and third filtered signals D2, D3 may be used.

Figure 9A:
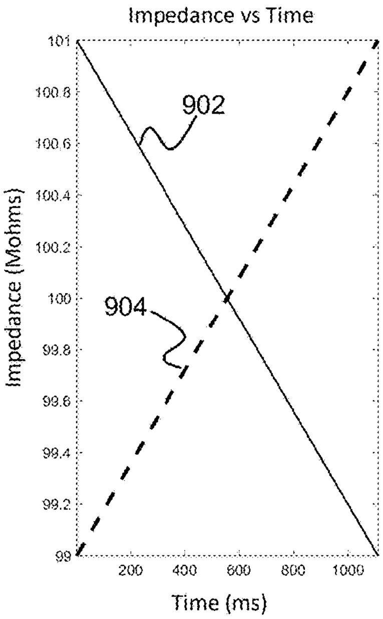
FIGS. 9A, 9B, 9C, 10A, 10B and 10C graphically illustrate the effect of time-varying impedance on phase of components of a signal derived by the measurement circuit of FIG. 6.
Figure 9B:
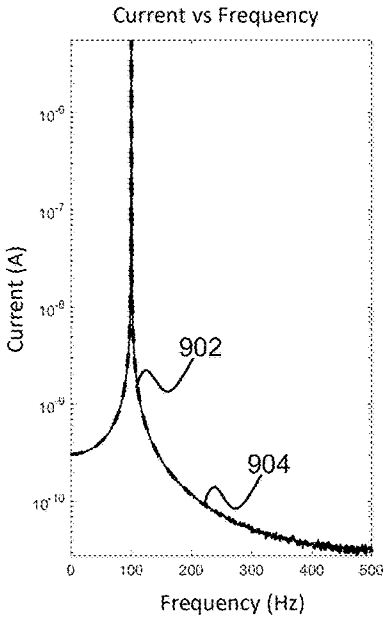
Figure 9C:
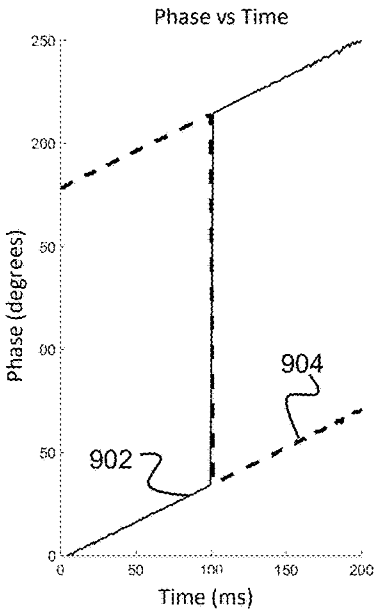

FIGS. 9A, 9B and 9C graphically illustrate the effect of time-varying impedance on phase of components of the digital output signal DO. FIG. 9A is a plot of impedance vs time for the cell 602 in two scenarios. In a first scenario, denoted by line 902, the impedance of the cell 602 is decreasing linearly with a first rate. In a second scenario, denoted by line 904, the impedance of the cell 602 is increasing linearly at a second rate which is equal to the first rate. FIG. 9B shows that the magnitude of corresponding responses of the cell 602 are substantially equal given equal but opposite trajectories of impedance of the cell 602 in the two scenarios. However, FIG. 9C shows that the phase response for the two scenarios is different and can be used to determine a direction of change in impedance of the cell 602.

Figure 10A:
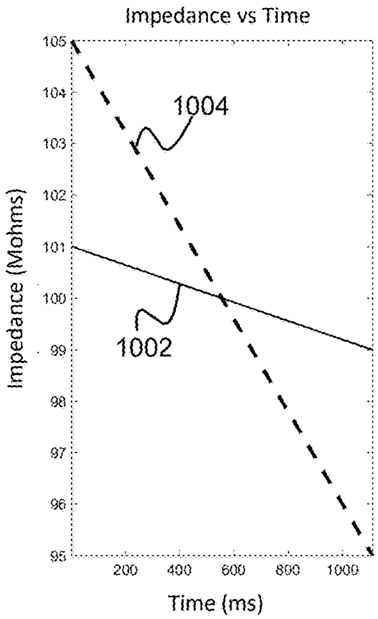
Figure 10B:
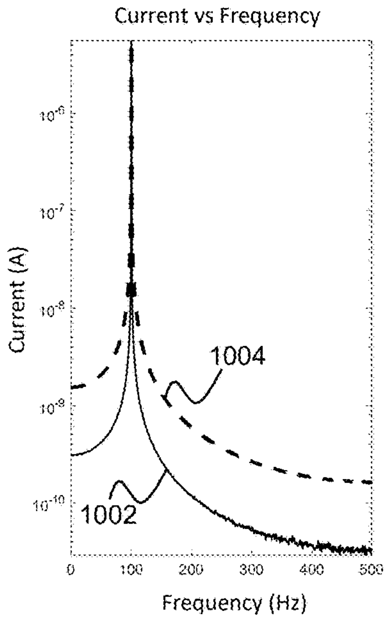
Figure 10C:
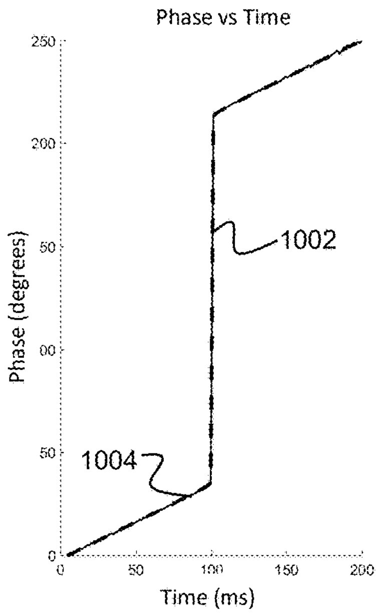

FIGS. 10A, 10B and 10C graphically illustrate the effect of time-varying impedance on phase of components of the digital output signal DO. FIG. 10A is a plot of impedance vs time for the cell 602 in two scenarios. In a first scenario, denoted by line 1002, the impedance of the cell 602 is decreasing linearly at a first rate. In a second scenario, denoted by line 1004, the impedance of the cell 602 is also decreasing linearly but at a faster rate than the first rate. FIG. 10B shows the corresponding magnitude of responses of the cell 602 to the respective scenarios. It can be seen that since the rate of decrease of impedance is different, so too are the magnitudes in the sidebands of the frequency response. However, since the direction of change of impedance is the same in both scenarios, the phase of each response is also the same, as shown in FIG. 10C.

Thus, the phase of the digital output signal DO may be used to determine a direction of change of impedance Z of the cell 602 from a single measurement. Any one of the combiners 708, 802 described above or herein may determine and output a direction of change of the impedance Z based on a phase of either of the second and third filtered signals D2, D3. The result of this may be an indication of the direction of change of impedance which may be output or used to improve measurement of impedance Z (as is described above).

A robust method of detecting a direction of change of impedance uses both of the second and third filtered signals D2, D3 to detect a phase difference between the second and third filtered signals D2, D3. In the case of an impedance which is increasing in magnitude, the phase difference will be less than zero. In the case of an impedance which is decreasing in magnitude, the phase difference will be greater than zero. This relationship is illustrated by the following set of equations, where n is the bin in which the stimulation frequency sits.

$$\text{Increasing: } (\phi_{n+1} - \phi_{n-1}) < 0$$

$$\text{Decreasing: } (\phi_{n+1} - \phi_{n-1}) > 0$$

It is noted that the complex signal resulting from an FFT, DFT, or Goertzel filter may require rotation or unwrapping to remove factors of pi. This ensures the phase is in the correct quadrant prior to measurement. Accordingly, the following steps may be taken to determine the direction of change of impedance. Firstly, calculate the phase of the FFT, DFT (i.e. the second and third filtered signals D2, D3). Secondly, compare the phase difference between the adjacent bins (filtered signals D2 and D3) to the centre frequency (filtered signal D1). If the phase difference is negative, the impedance is increasing across the measurement. If it is positive, the impedance is decreasing.

Since the phase and magnitude of the second and third filtered signals D2, D3 may be used to determine a direction and rate of change of impedance, this information may be used, for example by the combiner 802, to correct an initial impedance value obtained from the first filtered signal D1 for changes in impedance Z over time, thereby outputting a corrected impedance Z*. For example, the change in impedance across the measurement can be compensated for by calculating the difference in magnitude of the second and third filtered signals D2, D3 to the magnitude of the first filtered signal D1 multiplied by a constant k.

$$Z^* = Z_{meas} + k\Delta$$

$$Z^* = Z_{meas} + \Delta Z$$

Where ΔZ=f(Δ)

$$\Delta = \frac{Z_{n+1} - Z_{n-1}}{Z_n}$$

Where $Z_n$ is the absolute value of first filtered signal D1.

The change in impedance Z may be calculated as follows. First the difference in power between the second and first filtered signals D2, D1 is calculated. Second, the difference in power between the third and first filtered signals D3, D1 is calculated. Third, the ratio of these differences is calculated. Fourth, this ratio is multiplied by the phase difference between the second and third filtered signals. In doing so, the direction of change of the impedance is incorporated. This signed ratio is then multiplied by the constant k, which may be determined during calibration.

This change may then be subtracted from the initial calculation of impedance Z to obtain the corrected impedance Z.

As an alternative to using a transform based approach (such as DFT, FFT, Goertzel etc.), an autocorrelation of the digital output DO may be used to determine spectral leakage. As is known in the art, autocorrelation is calculated by measuring a correlation of a signal with a delayed version of itself over varying time intervals. Thus, autocorrelation is useful in analysing the periodicity and spectral content of signals.

Autocorrelation will peak at intervals equal to the period of any repeating patterns in a signal. For a perfectly periodic signal (such as a periodic sine wave) sampled coherently, the autocorrelation function of that signal should show clear, distinct peaks at delays corresponding to multiples of the period of the fundamental frequency of the signal. Where spectral leakage is zero or minimal, the autocorrelation function should return to zero (or near zero) between these peaks. When spectral leakage is present, the autocorrelation function may not decay as expected. Instead, it might show a higher baseline or smaller dips between the peaks, indicating that energy is spread across other frequencies other than the fundamental frequency or frequencies. The sharpness of the autocorrelation peaks can also indicate the presence of spectral leakage. Sharp, narrow peaks typically indicate a more spectrally pure signal, whereas broader peaks suggest a spread in frequency components due to leakage.

Use of autocorrelation may be advantageous when it is desired to analyse the time-domain characteristics of a signal such as the digital output DO or when the signal's frequency components are complex. By measuring the correlation of the digital output DO with itself over time, insight may be obtained into the periodicity and frequency spread without directly transforming into the frequency domain. This leads to a comparative reduction in required computational power, particularly when the corresponding transformed signal is complex. In addition, in practise, autocorrelation only needs to be calculated at a subset of discrete time lags, thereby further improving computational efficiency.

The time-domain autocorrelation $R_{(\tau)}$ of a continuous signal x(t) is defined by the integral:

$$R(\tau) = \int_{-\infty}^{\infty} x(t) \cdot x(t+\tau)dt$$

Here, T represents the time lag and $R_{(\tau)}$ quantifies how much the signal x(t) correlates with itself when shifted by T.

For a discrete signal x[n], which is more common in digital signal processing, the autocorrelation is given by the sum:

$$R[k] = \sum_{n=-\infty}^{\infty} x[n] \cdot x[n+k]$$

Here, k is the discrete lag parameter. The above equation may be implemented over a finite set of data points for practical computation, such that:

$$R[k] = \sum_{n=0}^{N-k-1} x[n] \cdot x[n+k]$$

For k=0,1,2, . . . , N−1, where N is the total number of samples in the signal. This finite sum approach assumes values outside the range of available data are zero (zero-padding).

Figure 11:
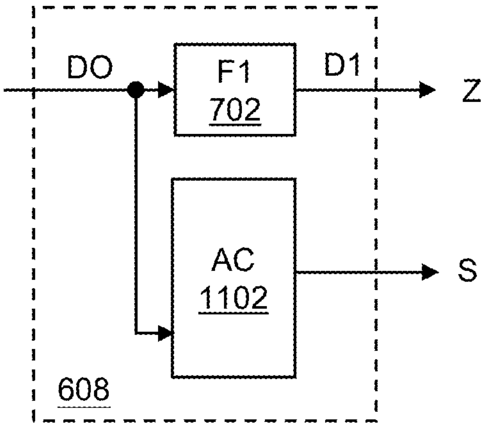
FIG. 11 is a schematic diagram of an example of processing circuitry of the measurement circuit of FIG. 6.

Having regard for the above, FIG. 11 is a block diagram of another example implementation of the processing circuitry 608. In this example, the processing circuitry 608 comprises the first filter 702 (similar to that shown in FIG. 7) and an autocorrelation module 1102.

The digital output signal DO is provided to the first filter 702 and the autocorrelation module 1202. The first filter 702 is configured to output the first filtered signal D1 which is provided as the impedance Z of the cell 602.

The autocorrelation module 1102 is configured to perform autocorrelation on the digital output signal DO, for example in the manner discussed above. In doing so, the autocorrelation module 1102 may determine one or more metrics associated with the periodicity and frequency spread of the digital output signal DO. The autocorrelation may be considered at three distinct time-lags. These time-lags may be equivalent to three distinct frequencies, such as the frequencies F1, F2, F3 in the FFT described above. The autocorrelation module 1002 may use one or more of these metrics to determine and output a score S related to the impedance stability of the cell 602. For example, as discussed above, a larger frequency spread indicates higher instability in impedance whereas a smaller frequency spread indicates a more stable impedance.

Elements of any one of the implementations described in FIGS. 7, 8 and 9 may be combined in any conceivable manner. For example, the processing circuitry 608 may be configured to both filter the digital output signal DO to obtain first, second and third filtered signals D1, D2, D3 in addition to performing autocorrelation on the signal DO. Additionally or alternatively, the result of the autocorrelation performed by autocorrelation module 1202 may be used by the combiner 802 to obtain the impedance Z* in a similar manner to how the combiner 802 may use the second and third filtered signals D2, D3 to control sampling and/or processing of the first filtered signal D1.

The above embodiments have been described with reference to a single coherent frequency in the stimulus AIN applied to the cell 602. Embodiments are not, however, limited to a single coherent frequency. In some scenarios, it may be advantageous to measure impedances at multiple frequencies.

When using coherent sampling, it is possible to use integer multiples of one coherent stimulus to provide multiple coherent stimuli at different frequencies. For example, consider the 1V, 100 Hz stimulus described above with reference to FIG. 5. If such a stimulus, herein referred to as a first stimulus, were applied at the working electrode WE of the cell 602 of FIG. 6, then an additional (second) stimulus at 400 Hz may be simultaneously applied at the working electrode WE, that second stimulus being an integer (4) multiple of the 100 Hz stimulus. The response as measured in the output signal AO at the counter electrode CE will comprise a first component responsive to the first, 100 Hz stimulus and a second component response to the second, 400 Hz stimulus.

Figure 12:
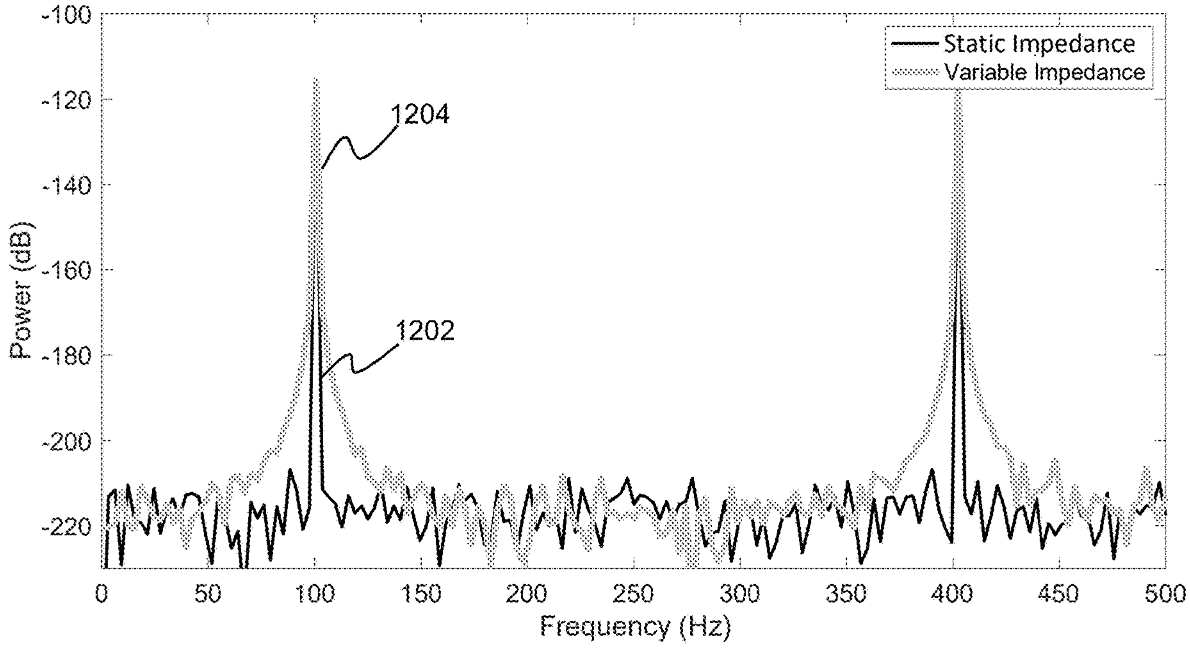
FIGS. 12 and 13 show frequency spectrums of responses of an electrochemical cell to a stimulus.

FIG. 12 is a graphical illustration of a frequency spectrum of respective first and second measured responses 1202, 1204 of the cell 602 responsive to an EIS stimulus comprising the first and second stimuli at 100 Hz and 400 Hz respectively, applied at the working electrode WE of the cell 602. The first measured response 1202 pertains to a scenario in which the impedance Z is constant over time. The second measured response 1204 pertains to a second scenario in which the impedance Z is time varying. The frequency spectrum shown in FIG. 11 was obtained by applying a Fourier transform to digital output DO output from the ADC 606 of the circuitry 600.

From FIG. 12 it can be seen that impedance values and their stability at two different frequencies (100 Hz and 400 Hz) can be obtained from the cell 602 simultaneously with a single combined EIS stimulus.

As is known in the art, the time taken to measure an electrochemical cell (such as the cells 100, 200, 602 described herein) using an EIS stimulus, provides time for chemical reactions to proceed, leading to drift of impedance of that cell. As such, to minimize drift, it is advantageous to minimise the time taken to perform the measurement, by minimising the duration of any single interrogation, and/or the number of oscillations per interrogation. Particularly at low frequencies, it is advantageous to minimize the number of oscillations (e.g. sinewaves) to minimize the measurement time and thus the impact on drift of cell impedance.

As such, any scoring of the cell (e.g. for cell stability and the like) needs to be robust to measurement with a low number of oscillations.

Say, for example, the score S is calculated by calculating the ratio of power in the centre frequency bin F1 with the sum of the power in the first and second side bins F2, F3 either side of the centre frequency bin F1. In the example shown in FIG. 5, the number N of complete oscillations of the stimulus over a sampling period is 33.

Figure 13:
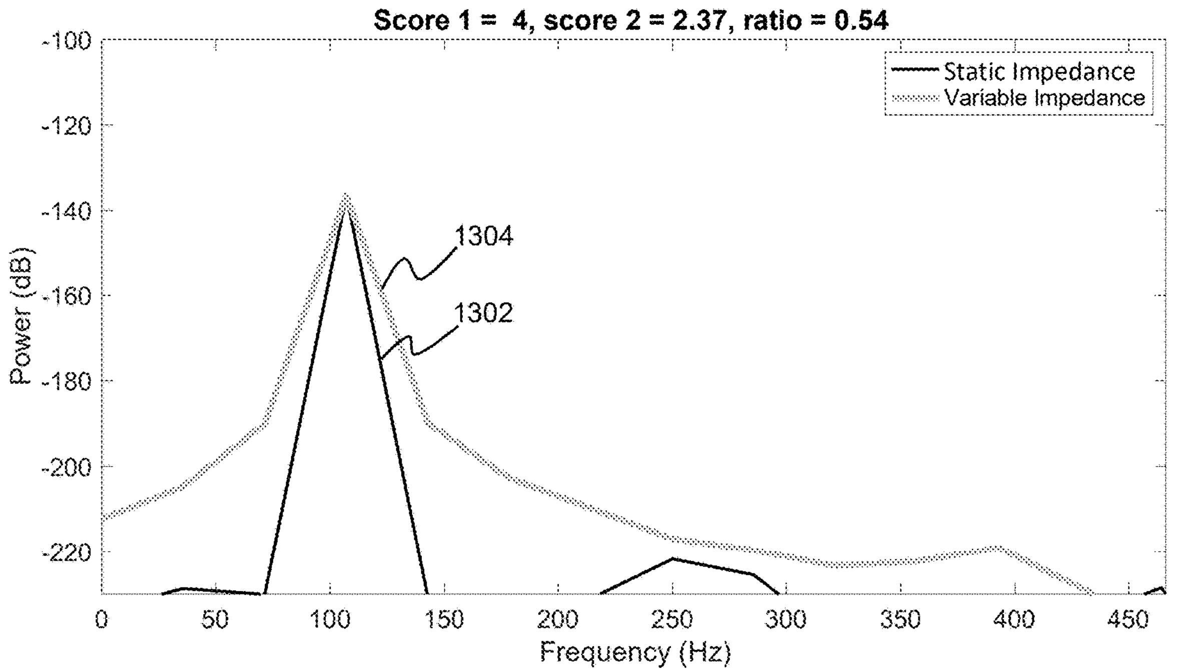

FIG. 13 graphically illustrates the corresponding frequency spectrum in which the number N of complete oscillations of the stimulus over the sampling period is 3. Respective first and second measured responses 1302, 1304 of the cell 602 responsive to a 1V, 100 Hz EIS stimulus, applied at the working electrode WE of the cell 602. The first measured response 1302 is for a static impedance Z and the second measured response 1302 is for a time varying impedance Z. It can be seen that whilst the absolute value of the score S shifts, the ratio of centre frequency F1 to the sum of side bin frequencies F2, F3 is relatively constant. Significantly the score S is still discriminative.

In the embodiments described above, coherent sampling is employed to improve the delineation of measured responses to EIS stimulation between constant and time-varying impedance conditions. The inventors have realised that whilst coherent sampling improves the distinction between these conditions, and thus the stability metrics obtained from the various techniques described above, such sampling is not strictly essential, as illustrated in FIGS. 14 and 15.

Figure 14:
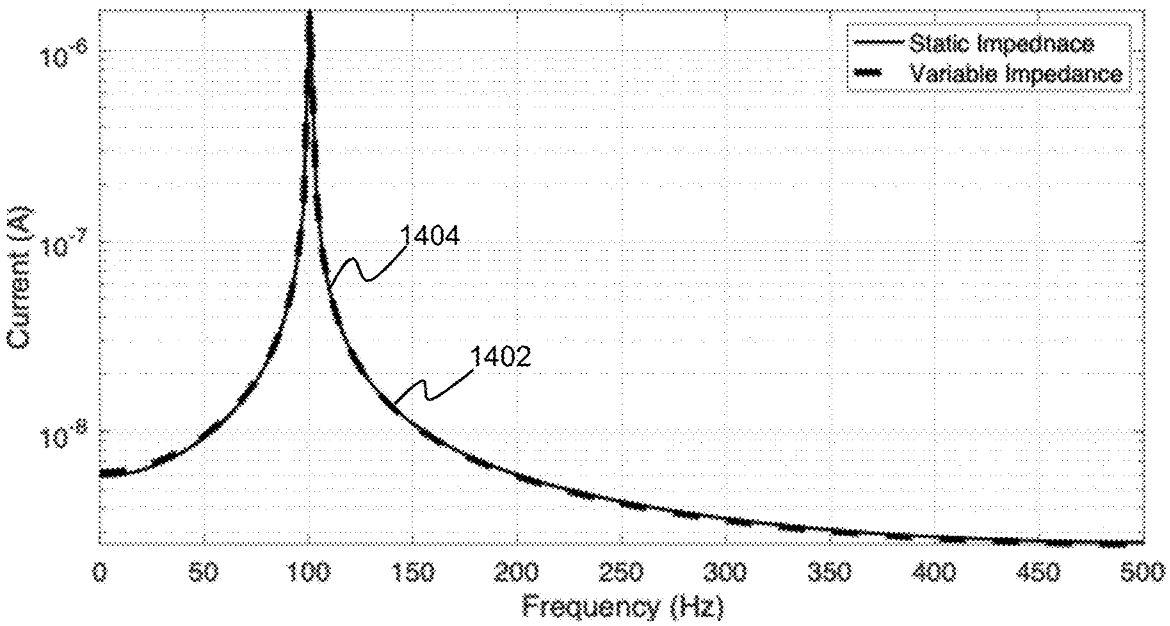
FIG. 14 is a graph showing time vs impedance for a stable impedance condition and a time varying impedance condition in an electrochemical cell.
Figure 15:
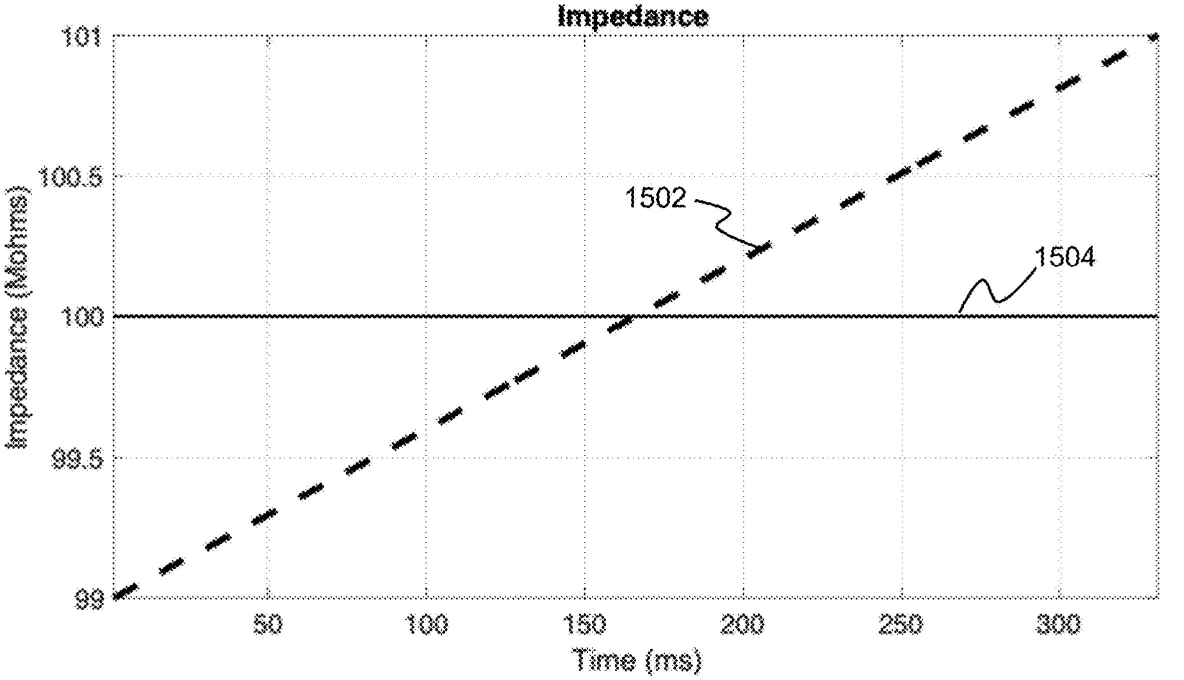
FIG. 15 is a frequency spectrum of responses of an electrochemical cell to a time-varying stimulus in the stable impedance condition and the time-varying impedance condition of FIG. 14.

FIG. 14 shows the frequency spectrum of first and second responses 1402, 1404 to static and increasing impedance conditions 1502, 1504 respectively, as shown in FIG. 15. Whilst the frequency spectrums 1402, 1404 are very similar, there is still a relative difference between the two spectrums of 0.2% (when compared to 26% relative change when coherently sampling). As such, a distinction can be made using the frequency spectrum between static and dynamic impedance. Nevertheless, these illustrations show that coherent sampling provides significant improvements in delineation.

Application to ISE

The present disclosure has particular application in systems comprising ion-selective electrodes (ISEs). As noted above, the cell 602 may be implemented with an ion-selective electrode (ISE). In an ISE system, impedance measurement provides critical insights into the dynamics at the interface between the electrode and the solution which ensure cell chemistry can be properly characterised, as will be discussed in detail below.

Figure 16:
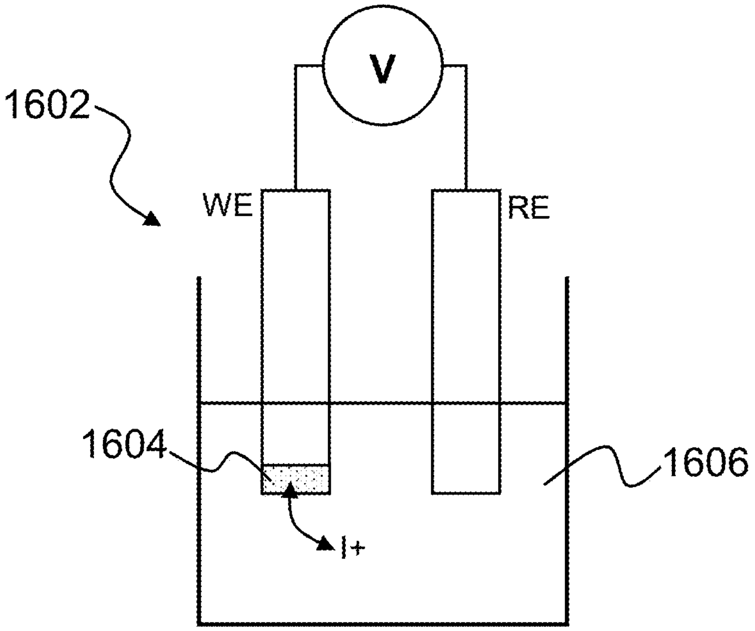
FIG. 16 is a schematic diagram of an electrochemical cell comprising an ion-selective electrode.

FIG. 16 shows a schematic diagram of an example electrochemical cell 1602 comprising an ion-selective electrode. The working electrode WE comprises an ion-selective membrane 1604, which may be configured to uptake only a specific ion (in this case the cation, I+) from an electrolyte solution 1606. As such, the potential difference between the working electrode WE and the reference electrode RE depends on the concentration of that particular ion analyte in the electrolyte solution 1606.

To accurately measure the potential difference across the cell 1602, as little as possible current (ideally no current) need flow into the cell 1602. Hence, a typical approach to voltage measurement is to couple each of the working and reference electrodes WE, RE to high input impedance buffers which are used, in turn, to drive one or more ADCs (e.g. two single ended ADCs or one differential ADC). A digital output signal is then derived which represents the potential difference between working and reference electrode WE, RE of the cell 1602.

The Nernst equation is fundamental in describing the response of an ISE to the activity of specific ions in solution. According to this equation, the potential difference across the ISE membrane is directly related to the logarithm of the ion activity in the solution. This relationship is given by:

$$E = E^0 - \frac{RT}{nF}\ln Q$$

Where:

- $E^0$ is the standard cell potential—a function of materials used for the working electrode WE and the electrolyte (specifically their Gibbs energy),
- R is the gas constant,
- F is the Faraday constant,
- T is the temperature in kelvin,
- N is the number of electrons transferred in the cell reaction, and
- Q is the reaction quotient of the cell reaction (the inverse of molar concentration, i.e. Q=1/M)

For the Nernst equation to accurately predict the electrode potential, the system must reach a stable equilibrium where the ion activities do not change over time. This stability is crucial because the impedance of the ISE, which affects the electrode's response, also becomes stable only when the concentration of ions at the membrane surface is constant. In practice, this means that any initial disturbances or gradients in ion concentration near the electrode surface must dissipate, allowing the system to reach a steady state where the diffusion layer adjacent to the electrode membrane is uniform. In this state the impedance is constant.

At equilibrium, the selective membrane of the ISE can effectively interact with the target ion, leading to a consistent potential that reflects the ion activity as dictated by the Nernst equation. In situations where the system has not yet reached equilibrium, the measured potential may not accurately represent the actual ion activity, as transient concentration gradients may cause fluctuations in potential. Thus, for reliable measurements with an electrochemical cell comprising an ISE, ensuring that the electrode system has reached equilibrium is imperative for the Nernst equation to hold true and provide meaningful and reproducible data.

In an ISE system, the impedance measurement provides critical insights into the dynamics at the interface between the electrode and the solution. Impedance in this context is primarily influenced by the charge transfer resistance and the double layer capacitance at the electrode's surface.

When an ISE system reaches equilibrium, the concentration of ions at the electrode surface becomes stable. The ion-selective membrane at this stage has a consistent ion flux across it, leading to a stable double layer (a structure formed by ions adhering to the electrode surface). The charge transfer, which is the movement of ions across the membrane, also stabilises as the ionic activity no longer changes. Consequently, the impedance measured using an AC stimulus (EIS stimulus) becomes constant because the conditions affecting both the resistance and capacitance at the electrode interface (such as ion concentration and mobility) are unchanging. At this stable state, the electrode exhibits a steady response that does not fluctuate with the AC signal's perturbations.

Before equilibrium is achieved, the ionic concentrations at the electrode surface are in flux. As the solution and the electrode interact, ions begin to accumulate or deplete at the interface, causing the double layer's properties to change dynamically. During this phase, the charge transfer resistance can vary as the ion concentrations adjust. Similarly, the capacitance of the double layer changes as the spatial distribution and the total number of ions at the electrode surface shift. These adjustments lead to fluctuations in impedance when measured with an AC stimulus. The changing impedance reflects the ongoing processes of reaching a stable ionic environment at the membrane.

AC (EIS) stimulus techniques such as those described herein for measuring and quantifying impedance stability are particularly useful for capturing dynamic changes. The cell 602 can be probed across a range of frequencies, each providing information about different aspects of the electrochemical processes (e.g. charge transfer kinetics, double layer effects etc.). This variability in impedance during the approach to equilibrium essentially provides a snapshot of the transient processes until the system stabilises, allowing for the accurate and reliable application of the Nernst equation at equilibrium.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog TM or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

It should be noted that the above-mentioned embodiments illustrate rather than limit the invention, and that those skilled in the art will be able to design many alternative embodiments without departing from the scope of the appended claims. The word “comprising” does not exclude the presence of elements or steps other than those listed in a claim, “a” or “an” does not exclude a plurality, and a single feature or other unit may fulfil the functions of several units recited in the claims. Any reference numerals or labels in the claims shall not be construed so as to limit their scope.

The invention claimed is:

1. Circuitry for characterising an electrochemical cell comprising at least one first electrode and a second electrode, the circuitry comprising:

drive circuitry configured to apply a stimulus to the at least one first electrode of the electrochemical cell, the stimulus having a first stimulation frequency; and measurement circuitry configured to sample a response of the electrochemical cell to the stimulus at a sampling frequency to obtain an output signal; and processing circuitry configured to determine a stability of an impedance of the electrochemical cell at the first stimulation frequency based on a comparison of a frequency spectrum of the stimulus to a frequency spectrum of the measured response;

wherein a first ratio of the first stimulation frequency to the sampling frequency is equal to a second ratio of a number of oscillations of the stimulus to a number of samples obtained by the measurement circuit over a given time period.

2. Circuitry of claim 1, wherein the processing circuitry is configured to:

determine a difference between the frequency spectrum of the stimulus and the frequency spectrum of the measured response to obtain a difference spectrum; and determined the stability based on the difference spectrum.

3. Circuitry of claim 2, wherein the processing circuitry is configured to determine the stability based on a profile of the difference spectrum.

4. Circuitry of claim 1, wherein the processing circuitry is configured to determine the impedance of the electrochemical cell at the first stimulation frequency.

5. Circuitry of claim 4, wherein determining the impedance of the electrochemical cell comprises measuring a first characteristic of the output signal at or near the first stimulation frequency.

6. Circuitry of claim 5, wherein the first characteristic comprises one or more of a magnitude and phase at or near the first stimulation frequency.

7. Circuitry of claim 5, wherein the processing circuitry is configured to:

apply a Fourier transform to the output signal to obtain a frequency domain representation of the output signal; and determine the first characteristic of output signal from the frequency domain representation.

8. Circuitry of claim 5, wherein the processing circuitry is configured to:

apply a Goertzel filter to the output signal at the first stimulation frequency to obtain the first characteristic.

9. Circuitry of claim 5, wherein the processing circuitry is configured to:

apply a band-pass filter to the output signal to obtain the first characteristic, the band- pass filter centred on the first stimulation frequency.

10. Circuitry of claim 5, wherein the processing circuitry is configured to:

determine a second characteristic in one or more frequency bands adjacent a frequency band comprising the first stimulation frequency; and determine, based on the second characteristic of the one or more frequency bands, a stability metric indicating the stability of the impedance of the electrochemical cell over time.

11. Circuitry of claim 10, wherein the processing circuitry is configured to:

determine a first magnitude in a first frequency band of the output signal having a frequency lower than the first stimulation frequency;

determine second magnitude in a second frequency band of the output signal having a frequency higher than the first stimulation frequency; and determine the stability metric based on the first and second magnitudes.

12. Circuitry of claim 11, wherein determining the stability metric comprises:

comparing the first and second magnitudes.

13. Circuitry of claim 11, wherein determining the stability metric comprises:

determining a difference between the first and second magnitudes, wherein the processing circuitry is configured to:

output warning signal or flag if the difference between the first and second magnitudes exceeds a predetermined instability threshold.

14. Circuitry of claim 10, wherein the processing circuitry is configured to:

determine a first phase in a first frequency band of the output signal having a frequency lower than the first stimulation frequency;

determine a second phase in a second frequency band of the output signal having a frequency higher than first stimulation frequency; and determine a direction of change of the impedance at the first stimulation frequency based on the first and second phases.

15. Circuitry of claim 10, wherein the processing circuitry is configured to determine the impedance of the electrochemical cell based on the determined stability metric.

16. Circuitry of claim 15, wherein determining the impedance comprises:

on determining, based on the stability metric, that the impedance is stable over a predetermined measurement period, calculating the impedance based on the first characteristic.

17. Circuitry of claim 15, wherein the impedance of the electrochemical cell is calculated based on the first characteristic measured during periods in which the stability metric indicates that stability of the impedance at the first stimulation frequency exceeds a predetermined stability threshold.

18. Circuitry of claim 4, wherein the processing circuitry is configured to:

determine an autocorrelation of the output signal; and determine, based on the autocorrelation, a stability metric indicating the stability of the impedance of the electrochemical cell over time.

19. Circuitry of claim 1, wherein the stimulus comprises at least a first component at the first stimulation frequency and at least a second component at a second stimulation frequency, the second stimulation frequency being an integer multiple of the first stimulation frequency, and wherein the processing circuitry configured to determine an impedance of the electrochemical cell at the second stimulation frequency based on the output signal.

20. Circuitry of claim 19, wherein determining the impedance of the electrochemical cell at the first stimulation frequency comprises determining a first characteristic of the output signal at or near the first stimulation frequency, and wherein determining the impedance of the electrochemical cell at the second stimulation frequency comprises determining a second characteristic of the output signal at or near the second stimulation frequency.

21. Circuitry of claim 1, wherein:

the drive circuitry comprises analog-to-digital converter (ADC);

the measurement circuitry comprises a digital-to-analog converter (DAC); and the ADC and DAC are clocked coherently.

22. Circuitry of claim 1, wherein the measurement circuitry is configured to:

determine a condition of the electrochemical cell based on the output signal.

23. Circuitry of claim 1, wherein the measurement circuitry comprises:

a transimpedance amplifier (TIA) or a current conveyor configured to convert an output of the electrochemical cell to generate the response for sampling by the ADC.

24. A system, comprising:

circuitry of claim 1; and the electrochemical cell.

25. The system of claim 24, wherein the electrochemical cell comprises an electrochemical sensor or a battery cell.

26. The system of claim 24, wherein the first electrode or the second electrode comprises an ion-selective electrode.

27. An electronic device, comprising the circuitry of claim 1, wherein the device comprises one of a continuous analyte monitor, a mobile computing device, a laptop computer, a tablet computer, a games console, a remote control device, a home automation controller or a domestic appliance, a toy, a robot, an audio player, a video player, or a mobile telephone, and a smartphone.

28. A method of characterising an electrochemical cell comprising at least one first electrode and a second electrode, the method comprising:

applying a stimulus to the at least one first electrode of the electrochemical cell, the stimulus having a first stimulation frequency;

sampling a response of the electrochemical cell to the stimulus at a sampling frequency to generate a digital output signal; and determining an impedance of the electrochemical cell at the first stimulation frequency based on the digital output signal, wherein a first ratio of the first stimulation frequency to the sampling frequency is substantially equal to a second ratio of a number of oscillations of the stimulus to a number of samples obtained by the measurement circuit over a given time period.

* * * * *